United States Patent
Yoshida et al.

(10) Patent No.: US 10,014,205 B2
(45) Date of Patent: Jul. 3, 2018

(54) SUBSTRATE CONVEYANCE ROBOT AND OPERATING METHOD THEREOF

(71) Applicants: KAWASAKI JUKOGYO KABUSHIKI KAISHA, Kobi-shi, Hyogo (JP); KAWASAKI ROBOTICS (USA), INC., Wixom, MI (US)

(72) Inventors: Masaya Yoshida, Himeji (JP); Takao Yamaguchi, Fremnog, CA (US); Yuji Tanaka, Sunnyvale, CA (US); Hajime Nakahara, San Jose, CA (US); Avish Ashok Bharwani, Santa Clara, CA (US); Ming Zeng, San Jose, CA (US); Hui Kuen Chan, San Francisco, CA (US)

(73) Assignees: KAWASAKI JUKOGYO KABUSHIKI KAISHA, Kobe (JP); KAWASAKI ROBOTICS (USA), INC., Wixom, MI (US)

( * ) Notice: Subject to any disclaimer, the term of this patent is extended or adjusted under 35 U.S.C. 154(b) by 212 days.

(21) Appl. No.: 14/968,148

(22) Filed: Dec. 14, 2015

(65) Prior Publication Data
US 2017/0170050 A1 Jun. 15, 2017

(51) Int. Cl.
*H01L 21/683* (2006.01)
*H01L 21/67* (2006.01)
*H01L 21/687* (2006.01)
*H01L 21/677* (2006.01)

(52) U.S. Cl.
CPC .... *H01L 21/6838* (2013.01); *H01L 21/67253* (2013.01); *H01L 21/67259* (2013.01); *H01L 21/67706* (2013.01); *H01L 21/68707* (2013.01)

(58) Field of Classification Search
CPC .......... H01L 21/6838; H01L 21/67253; H01L 21/67259; H01L 21/67706;
(Continued)

(56) References Cited

U.S. PATENT DOCUMENTS

| 6,002,971 A * | 12/1999 | Lucas | B25J 9/1664 |
| | | | 700/213 |
| 2002/0041102 A1 * | 4/2002 | Krauskopf | H01L 21/68707 |
| | | | 294/213 |

(Continued)

FOREIGN PATENT DOCUMENTS

| JP | H09-008107 A | 1/1997 |
| JP | 2002-246443 A | 8/2002 |
| JP | 2012-049357 A | 3/2012 |

OTHER PUBLICATIONS

Jan. 31, 2017 International Search Report issued in International Patent Application No. PCT/JP2016/087015.

*Primary Examiner* — Bao Long T Nguyen
(74) *Attorney, Agent, or Firm* — Oliff PLC (57) ABSTRACT

A substrate conveyance robot has an end effector provided to a robot arm and including a substrate holding unit configured to hold a substrate, arm drive unit configured to drive the robot arm, a robot control unit configured to control the arm drive unit, and a holding force detection unit configured to detect a substrate holding force exerted by the substrate holding unit. The robot control unit controls the arm drive unit based on an upper limit value of at least one of acceleration and speed of the end effector which are determined in accordance with the substrate holding force detected by the holding force detection unit.

10 Claims, 11 Drawing Sheets

(58) Field of Classification Search
CPC .............. H01L 21/68707; H01L 21/673; H01L 21/687; H01L 21/67721–21/68728; B25J 11/0095; B25J 9/1612; B25J 9/1651; B25J 9/1674; B25J 9/16; G05B 2219/39247; G05B 2219/39528; G05B 2219/39532; Y10S 901/09; Y10S 901/14; Y10S 901/31; Y10S 901/36; Y10S 901/40; Y10S 901/46
USPC .......... 700/260, 250, 258; 901/9, 14, 31, 36, 901/40, 46; 318/586.16, 568.18
See application file for complete search history.

(56) References Cited

U.S. PATENT DOCUMENTS

| | | | | |
|---|---|---|---|---|
| 2006/0245906 | A1* | 11/2006 | Pelzmann | H01L 21/67109 414/744.8 |
| 2007/0147976 | A1* | 6/2007 | Rice | G03F 7/70991 414/217 |
| 2009/0175705 | A1* | 7/2009 | Nakao | H01L 21/67098 414/196 |
| 2012/0064734 | A1* | 3/2012 | Takahashi | H01L 21/68707 438/795 |
| 2013/0064637 | A1* | 3/2013 | Hosek | H01L 21/67742 414/800 |
| 2013/0071218 | A1* | 3/2013 | Hosek | H01L 21/67259 414/744.5 |
| 2013/0294877 | A1* | 11/2013 | Hosek | H01L 21/683 414/744.5 |
| 2014/0188277 | A1* | 7/2014 | Lee | B25J 15/0033 700/258 |

* cited by examiner

SUBSTRATE CONVEYANCE ROBOT AND OPERATING METHOD THEREOF

TECHNICAL FIELD

The present invention relates to a substrate conveyance robot for conveying substrates such as semiconductor wafers and liquid crystal glass substrates, and to an operating method of the same.

BACKGROUND ART

Conventionally, a substrate conveyance robot is used as a means for conveying substrates (plate members) such as semiconductor wafers and liquid crystal glass substrates. For example, the substrate conveyance robot has an articulated robot arm and an end effector (hand) provided to a distal end of the robot arm. The end effector has a substrate holding unit configured to hold a substrate thereon.

Usually, a plurality of wafers are stored in a substrate storing container such as a FOUP (wafer cassette). The substrate conveyance robot takes a wafer to be conveyed out from the inside of the substrate storing container and conveys the same to the side of a processing apparatus for treating the wafer. Alternatively, it takes a treated wafer out from a wafer holder on the processing apparatus side and stores the same inside the substrate storing container.

When taking a wafer out from the substrate storing container or the wafer holder using the substrate conveying robot, operation of the robot arm is controlled by a robot controller so as to insert the end effector into a vertical interval between wafers. From this state, the end effector is elevated so as to place a wafer to be conveyed on the end effector, and the wafer is fixed on the end effector by means of the substrate holding unit.

A wafer conveyance time from a starting point to a destination point by means of the substrate conveyance robot influences throughput of the wafer processing. Therefore, it is necessary to speed-up the robot operation so as to shorten the conveyance time in order to enhance throughput. Here, when trying to speed-up the robot operation so as to shorten the conveyance time, the acceleration (positive acceleration, negative acceleration) given to wafers at start-ups and stops of the operation is increased.

Accordingly, the substrate holding unit for fixing a wafer to the end effector is provided so that the wafer is not displaced from a predetermined position on the end effector or does not come off the end effector and fall, even when a large acceleration is given to the wafer.

Such substrate holding unit include a system in which the back surface of the wafer placed on the end effector is sucked by means of vacuum power (suction system), for example. Also, other substrate holding unit include a system in which an edge portion of the wafer placed on the end effector is engaged with a fixed engagement portion and a movable engagement portion so as to grip and fix the wafer by these engagement portions (edge grip system).

However, the wafer is sometimes insufficiently fixed to the end effector by the substrate holding unit for various reasons. When the wafer is insufficiently fixed, there is a risk that the wafer could be displaced from the predetermined position on the end effector during conveyance or comes off the end effector and falls.

In order to address this problem, a technology is proposed, which detects a displacement amount of the wafer from the predetermined position on the end effector, and when the displacement amount exceeds the predetermined threshold, restrains the acceleration of the robot arm operation and continues the conveyance operation (Patent Literature 1).

CITATION LIST

Patent Literature

[Patent Document 1] Japanese Patent Application Laid-Open No. 2012-049357

SUMMARY OF INVENTION

Objects to be Achieved by the Invention

The above-stated conventional handling method restrains the acceleration of the robot arm operation based on the displacement amount of the wafer on the end effector. Therefore, the wafer is judged to be normally fixed unless the wafer is displaced from the predetermined position on the end effector and the robot arm is made to perform a normal conveyance operation.

However, actually, there is a case that holding force of the substrate holding unit is insufficient even when the wafer is in the predetermined position on the end effector, and the above-stated conventional handling method cannot deal with such a case.

For example, when the wafer is warped due to heat treatment as a semiconductor manufacturing process, the substrate holding unit of the suction system utilizing the vacuum power cannot achieve a desired holding force since a gap is formed between the wafer suction surface (wafer placing surface) of the end effector and the back surface of the wafer, and sufficient evacuation cannot be achieved in the suction portion.

Even when a desired holding force is not achieved due to the wafer warp, the above-stated conventional handling method cannot detect an abnormality and the wafer is judged to be normally fixed as long as the wafer is positioned at the predetermined position on the end effector, and the robot arm is made to perform a normal conveyance operation. Accordingly, there is a risk that the wafer could be displaced from the predetermined position on the end effector or the wafer comes off the end effector and falls due to the acceleration acted on the wafer at a startup of conveyance, for example.

Also when the back surface (suction side) of the wafer is damaged or stained during the semiconductor manufacturing process, a desired holding force sometimes fails to be achieved since sufficient evacuation cannot be performed in the wafer suction portion of the end effector. Also in this case, there is a possibility that the above-stated conventional handling method cannot properly deal with the problem.

Also, even when the wafer is not warped nor damaged or stained, the holding force sometimes declines due to a cause on the substrate holding unit side. For example, pressure of a plunger used in the substrate holding unit of the edge grip system declines or capacity of a vacuum source of the substrate holding unit of the suction system declines, resulting in a possibility that the wafer holding force could decline. Also in this case, there is a risk that the wafer could be displaced from the predetermined position on the end effector or the wafer comes off the end effector and falls due to the acceleration acted on the wafer during conveyance since the conventional handling method cannot detect an abnormality unless the wafer is displaced.

The present invention is made considering the above-stated problems of the conventional technology, and an object thereof is to provide a substrate conveyance robot capable of surely preventing displacement and fall of a substrate while continuing a substrate conveyance operation regardless of existence of displacement of the substrate even when the holding force of the substrate in an end effector declines, and an operating method of the same.

Means for Achieving the Objects

In order to achieve the above-mentioned objects, a substrate conveyance robot according to a first aspect of the present invention includes a robot arm, an end effector provided to the robot arm, the end effector having a substrate holding unit configured to hold a substrate, an arm drive unit configured to drive the robot arm, a robot control unit configured to control the arm drive unit, and a holding force detection unit configured to detect a substrate holding force exerted by the substrate holding unit, wherein the robot control unit is configured to control the arm drive unit based on an upper limit value of at least one of an acceleration and a speed of the end effector which are determined in accordance with the substrate holding force detected by the holding force detection unit.

A second aspect of the invention is that, in the first aspect, the robot control unit is configured to control the arm drive unit based on both the upper limit value of the acceleration and the upper limit value of the speed of the end effector.

A third aspect of the invention is that, in the first or second aspect, the substrate holding unit has a holding force generation unit configured to generate the substrate holding force, and the robot control unit is configured to increase a power of the holding force generation unit when the substrate holding force declines below a normal value thereof.

A fourth aspect of the invention is that, in any one of the first to third aspects, the substrate holding unit is configured to vacuum suck the substrate, and the holding force detection unit is configured to detect a vacuum degree of the substrate holding unit.

A fifth aspect of the invention is that, in any one of the first to third aspects, the substrate holding unit has a movable engagement portion configured to releasably engages with an edge portion of the substrate, and a plunger configured to drive the movable engagement portion, and the holding force detection unit is configured to detect a pressure of the plunger.

A sixth aspect of the invention is that, in any one of the first to fifth aspects, the robot control unit is configured to continuously vary the upper limit value in accordance with the substrate holding force detected by the holding force detection unit.

A seventh aspect of the invention is that, in any one of the first to fifth aspects, the robot control unit is configured to vary the upper limit value stepwise in accordance with the substrate holding force detected by the holding force detection unit.

In order to achieve the above-mentioned objects, an eighth aspect of the present invention is an operating method of a substrate conveyance robot including a robot arm provided with an end effector including a substrate holding unit configured to hold a substrate, the operating method including: a holding force detection step of detecting a substrate holding force exerted by the substrate holding unit; an upper limit value determination step of determining an upper limit value of at least one of an acceleration and a speed of the end effector in accordance with the substrate holding force; and an arm drive step of driving the robot arm based on the upper limit value of the end effector.

A ninth aspect of the invention is that, in the arm drive step, the robot arm is driven based on both the upper limit value of the acceleration and the upper limit value of the speed of the end effector.

A tenth aspect of the invention is that, in the eighth or ninth aspect, the substrate holding unit has a holding force generation unit configured to generate the substrate holding force, and in a power of the holding force generation unit is increased when the substrate holding force declines below a normal value thereof.

An eleventh aspect of the present invention is that, in any one of the eighth to tenth aspects, the upper limit value is continuously varied in accordance with the substrate holding force.

A twelfth aspect of the invention is that, in any one of the eighth to tenth aspects, the upper limit value is varied stepwise in accordance with the substrate holding force.

Note that, "substrate holding force" herein includes a value correlated with an actual holding force in addition to the actual holding force measured directly by a force sensor or the like. Here, the value correlated with the actual holding force includes a vacuum degree in a suction type end effector and a plunger pressure in an edge-grip type end effector, for example.

Advantageous Effect of the Invention

According to the present invention, a substrate conveyance robot capable of surely preventing displacement and fall of a substrate while continuing a substrate conveyance operation regardless of existence of displacement of the substrate even when the holding force of the substrate in an end effector declines, and operating method of the same can be provided.

EMBODIMENT FOR CARRYING OUT THE INVENTION

Hereunder, a substrate conveyance robot according to one embodiment of the present invention will be described referring to the drawings. Note that the substrate conveyance robot according to this embodiment is particularly suitable for conveying wafers for manufacturing semiconductors. However, substrates to be conveyed by the substrate conveyance robot according to the present invention are not limited to wafers for manufacturing semiconductors and include various substrates (plate members) such as glass substrates for manufacturing liquid crystal panels.

Figure 1:
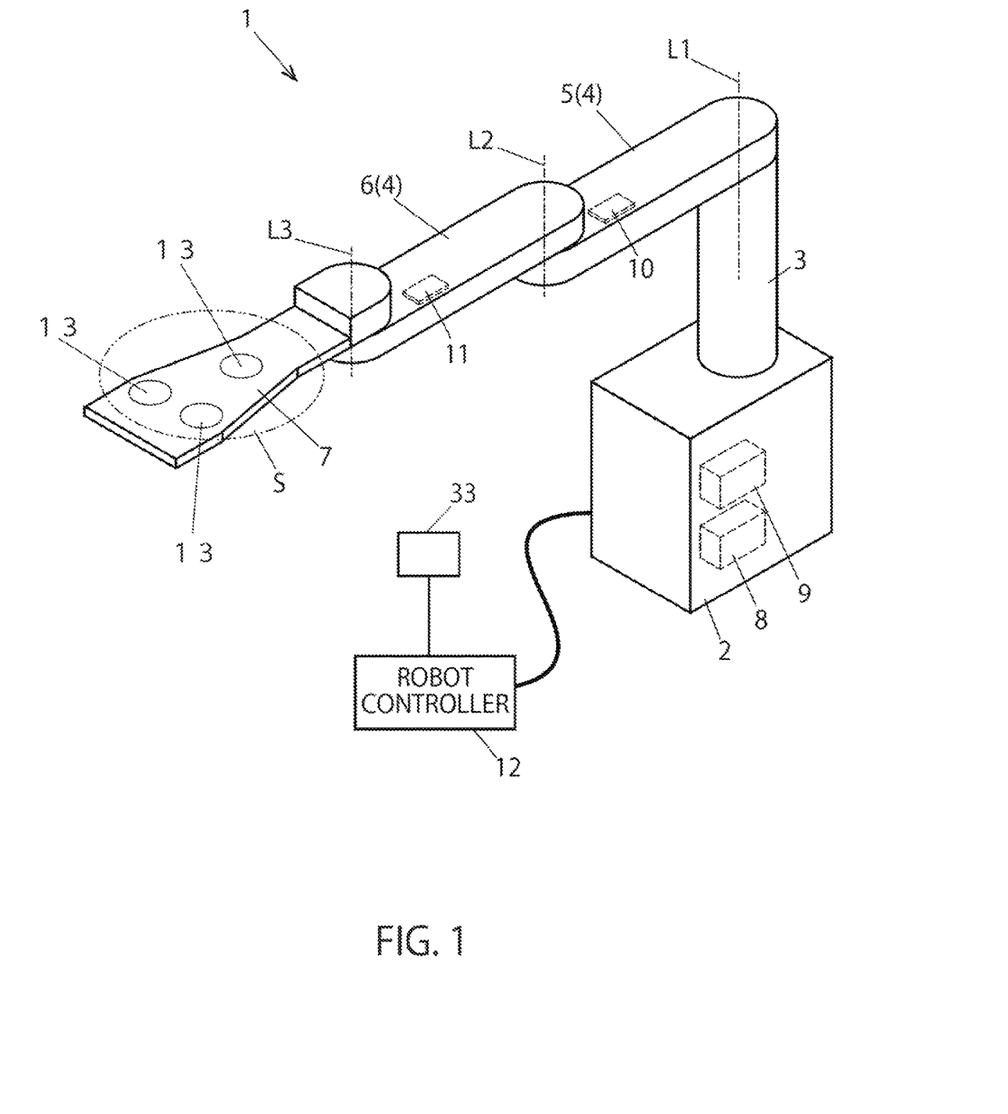
FIG. 1 is a schematic perspective view of a substrate conveyance robot according to an embodiment of the present invention.

As illustrated in FIG. 1, a substrate conveyance robot 1 according to this embodiment has a base 2. A rotary main shaft 3 is provided on the base 2 so as to be elevated/lowered along a first rotational axis line L1.

The proximal end of a robot arm 4 is connected on the upper end of the rotary main shaft 3. The robot arm 4 has a first link member 5 including the first rotational axis line L1 on the proximal end thereof and also including a second rotational axis line L2 on the distal end thereof, and a second link member 6 including the second rotational axis line L2 on the proximal end thereof and also including a third rotational axis line L3 on the distal end thereof. An end effector (hand) 7 is provided on the distal end of the second link member 6 so as to rotate about the third rotational axis line L3.

The elevating/lowering operation and the rotating operation of the rotary main shaft 3 are performed by drive sources 8, 9 provided inside the base 2, respectively. The rotary main shaft 3 rotates about the first rotational axis line L1 so that the first link member 5 rotates about the first rotational axis line L1 integrally with the rotary main shaft 3.

The rotational operation of the second link member 6 with respect to the first link member 5 is performed by a drive source 10 provided inside the first link member 5. The rotating operation of the end effector 7 with respect to the second link member 6 is performed by a drive source 11 provided inside the second link member 6.

The above-stated drive sources 8, 9, 10, 11 configure an arm drive unit in the present invention. The drive sources 8, 9, 10, 11 can be configured by servo motors, for example.

Each drive source 8, 9, 10, 11 is controlled by a robot controller 12. Thereby, the elevating/lowering operation and the rotating (extending/contracting) operation of the robot arm 4 having the end effector 7 are controlled.

Note that a configuration of the robot arm and its drive unit of the substrate conveying robot according to the present invention is not limited to the configuration above as illustrated in FIG. 1, and any configurations capable of positioning the end effector to a substrate to be conveyed can be employed.

Figure 2:
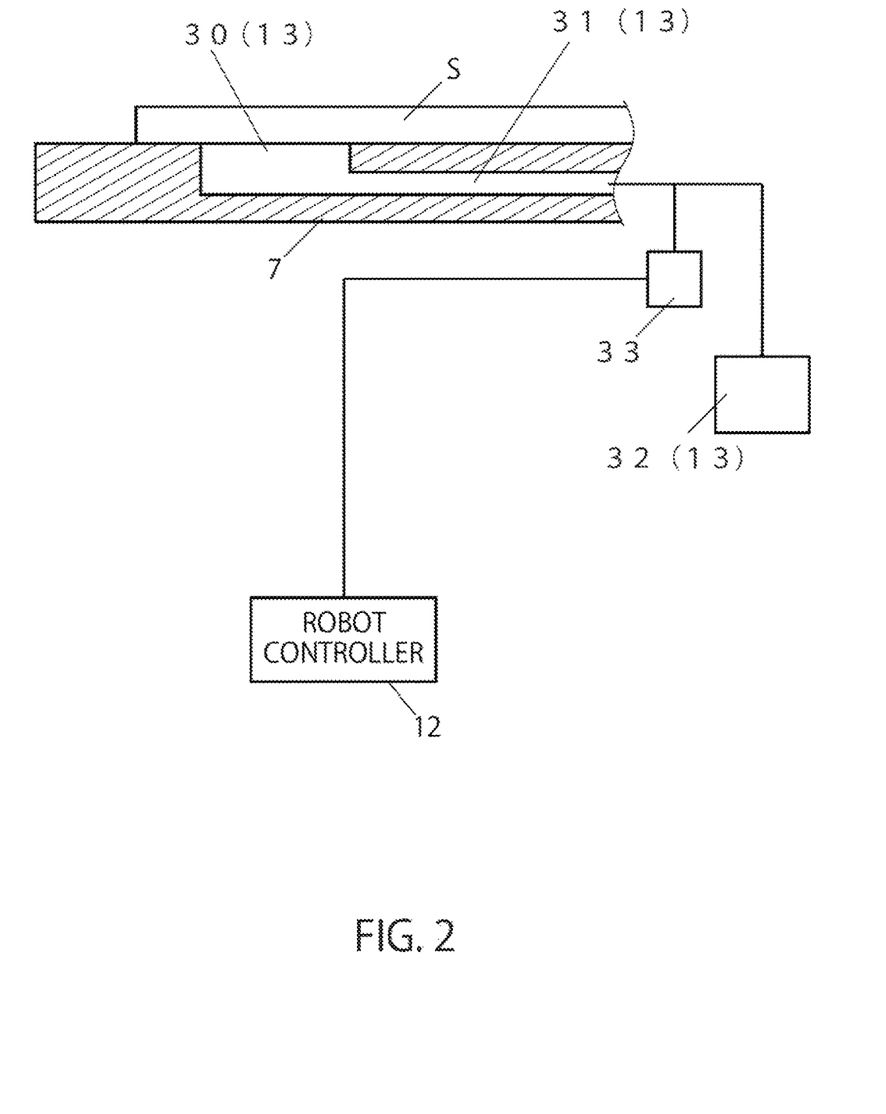
FIG. 2 is an enlarged schematic view of a main part of the substrate conveyance robot in FIG. 1.

Moreover, as illustrated in FIG. 1 and FIG. 2, the substrate conveying robot 1 according to this embodiment has a substrate holding unit 13 for holding a substrate S on the end effector 7 by means of vacuum suction. The substrate holding unit 13 has a substrate holding aperture 30 formed on a substrate placing surface of the end effector 7, an evacuating flow passage 31 formed so as to be communicated with the substrate holding aperture 30, and a vacuum source (holding force generation unit) 32 communicated with the evacuating flow passage 31.

A vacuum sensor 33 for detecting vacuum degree of the substrate holding unit 13 as an analog output is connected in the middle of the evacuating flow passage 31. Here, the vacuum degree of the substrate holding unit 13 corresponds to the substrate holding force in the end effector 7. Also, the vacuum sensor 33 corresponds to the holding force detection unit. An output signal of the vacuum sensor (holding force detection unit) 33 is transmitted to the robot controller 12.

Figure 3:
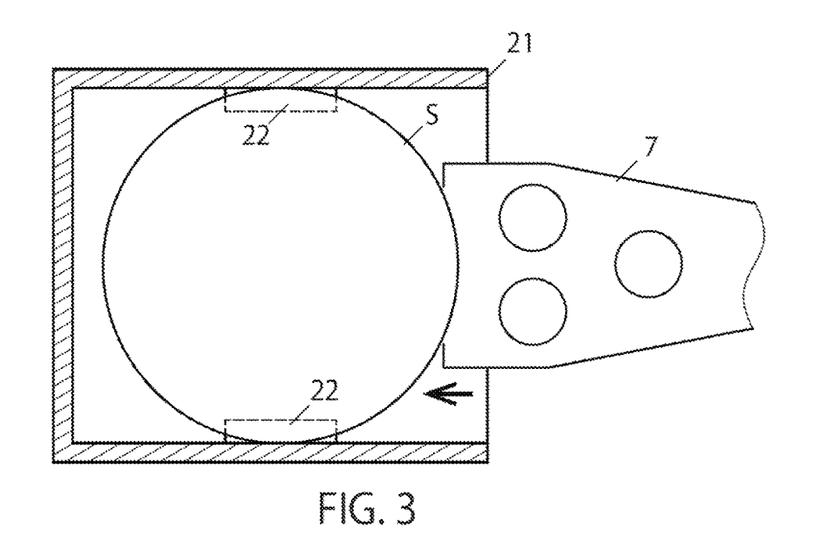
FIG. 3 is a schematic plan view for explaining a substrate conveyance process by means of the substrate conveyance robot in FIG. 1.
Figure 4:
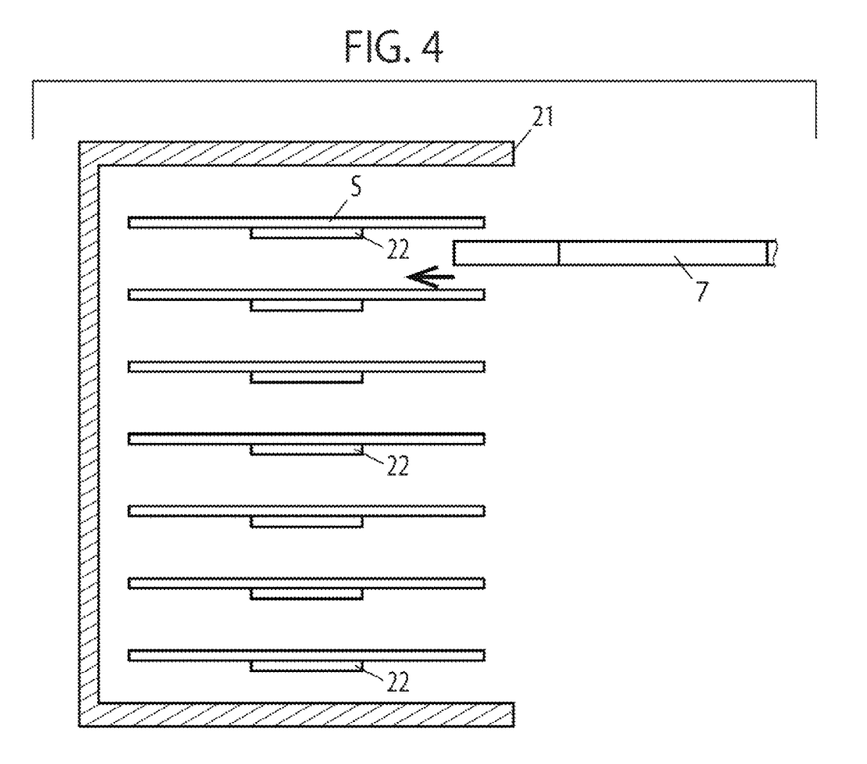
FIG. 4 is a schematic side view for explaining the substrate conveyance process by means of the substrate conveyance robot in FIG. 1.

When holding the substrate S by the end effector 7 of the substrate conveyance robot 1, in a state that evacuation in the substrate holding unit 13 is stopped, the end effector 7 is advanced to the back surface side of the substrate S to be conveyed placed on a substrate supporting portion 22 of a substrate storing container 21, and then the end effector 7 is elevated so as to place the substrate S on its substrate placing surface, as illustrated in FIG. 3 and FIG. 4. In this state, evacuation in the substrate holding unit 13 is started so as to vacuum suck the substrate S onto the placing surface of the end effector 7.

At this time, if the substrate S is warped due to a heat treatment or the like in the substrate manufacturing process, or the back surface of the substrate S is damaged or stained, there is a possibility that an appropriate evacuation cannot be performed and a desired substrate holding force cannot be achieved.

The substrate conveyance robot 1 according to this embodiment can deal with also such a state that a desired substrate holding force cannot be achieved. Hereunder, this point will be described.

If the vacuum degree (substrate holding force) detected by the vacuum sensor (holding force detection unit) 33 is below a normal value when holding the substrate S by the end effector 7 or when conveying the held substrate S, the robot controller 12 controls the arm drive unit based on the upper limit value of acceleration of the end effector 7 determined in accordance with the substrate holding force.

Figure 5:
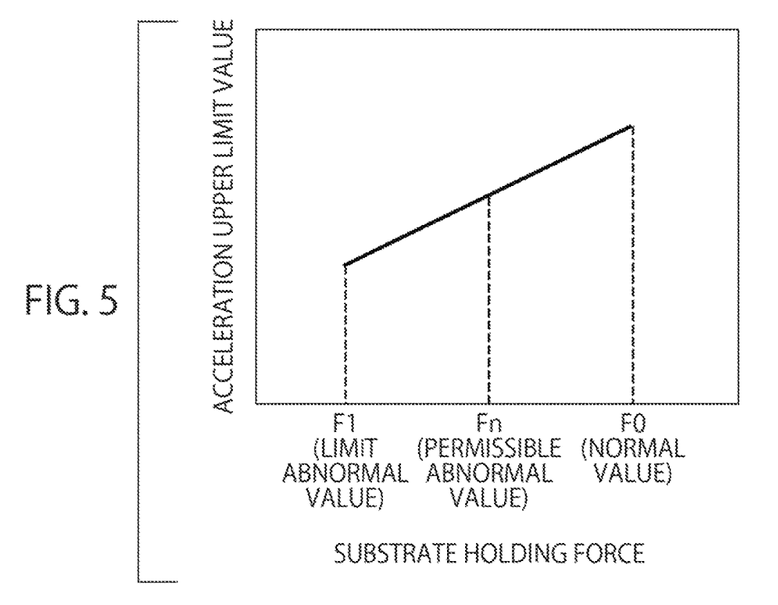
FIG. 5 illustrates the relation between a substrate holding force and an acceleration upper limit value in the substrate conveyance robot in FIG. 1.

More specifically, when the substrate holding force is a permissible abnormal value Fn which is below a normal value F0 as illustrated in FIG. 5, the robot controller 12 decreases the upper limit value of acceleration of the end effector 7 in accordance with a degradation amount of the substrate holding force.

Here, the permissible abnormal value Fn of the substrate holding force refers to a value which is below the normal value F0 but determined to be able to continue the conveyance operation of the robot arm 4 by applying the control method according to this embodiment. Such a value can be obtained by experiments and dynamic calculations.

Then, after determining the upper limit value of acceleration of the end effector 7 based on the permissible abnormal value Fn, the robot controller 12 continues to perform the conveyance operation of the robot arm 4 so that acceleration of the end effector 7 does not exceed said upper limit value.

Note that, when the substrate holding force further degrades and reaches a limit abnormal value F1, the robot controller 12 stops the conveyance operation of the robot arm 4.

By the way, a factor that force is applied on a substrate during conveyance is an inertial force generated in proportion to acceleration in a translational operation, and this inertial force in the translational operation is mainly taken into consideration to the above-stated control method based on the upper limit value of acceleration.

In contrast, a factor that force is applied on a substrate during conveyance is not only the above-stated inertial force in the translational operation. For example, in a rotational operation, a centrifugal force in proportion to the square of a rotational speed acts on the substrate. Also, in an operation such as an elevating/lowering operation that the substrate receives a wind pressure, a wind pressure in proportion to the square of an operation speed acts on the substrate. Further, the inertial force in proportion to the operation speed at an emergency stop acts on the substrate, provided that time until the operation stop at the emergency stop is constant.

Therefore, it is desirable that a control is performed based on the upper limit value of one of the above-mentioned different speeds (translational, rotational), or the upper limit value of a combination of two or more of these speeds.

Figure 6:
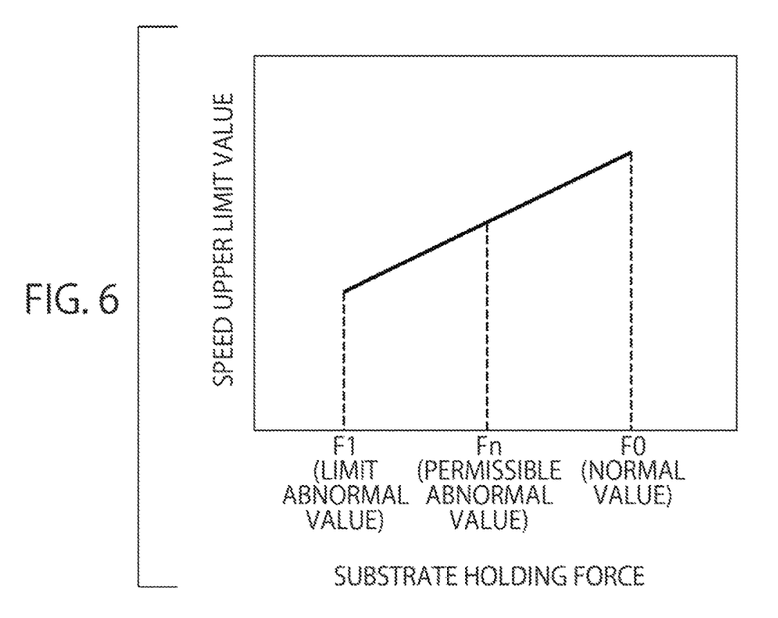
FIG. 6 illustrates the relation between a substrate holding force and a speed upper limit value in the substrate conveyance robot in FIG. 1.

Accordingly, in the substrate conveyance robot according to this embodiment, when the substrate holding force is the permissible abnormal value Fn which is below the normal value F0 as illustrated in FIG. 6, the robot controller 12 decreases the upper limit value of speed of the end effector 7 in accordance with a degradation amount of the substrate holding force. Then, the robot controller 12 performs the conveyance operation of the robot arm 4 so that speed of the end effector 7 does not exceed said upper limit value.

Namely, when the vacuum degree (substrate holding force) detected by the vacuum sensor (holding force detection unit) 33 is the permissible abnormal value Fn below the normal value F0, the robot controller 12 of the substrate conveyance robot 1 according to this embodiment decreases the upper limit values of acceleration and speed of the robot arm 4 in accordance with the degradation amount of the vacuum degree and performs the conveyance operation of the robot arm 4 based on altered each upper limit value.

In the above-stated control in accordance with the upper limit value of acceleration and the upper limit value of speed, different parameters may be limited properly in accordance with the patterns of the substrate conveyance operation. Namely, in the translational operation, the upper limit value of acceleration is set; in the rotational operation, the upper limit value of rotational speed is set; in an operation such as the elevating/lowering operation that the substrate receives a wind pressure, the upper limit value of speed of said operation is set; and in an emergency stop, the upper limit value of operation speed at the emergency stop is set.

Note that, though FIG. 5 and FIG. 6 illustrate an example that the substrate holding force and the upper limit value are in a linear relation, the substrate holding force and the upper limit value are in a relation proportional to the square, with respect to the upper limit value of speed of the rotational operation and the upper limit value of speed of the elevating/lowering operation or the like.

Figure 7:
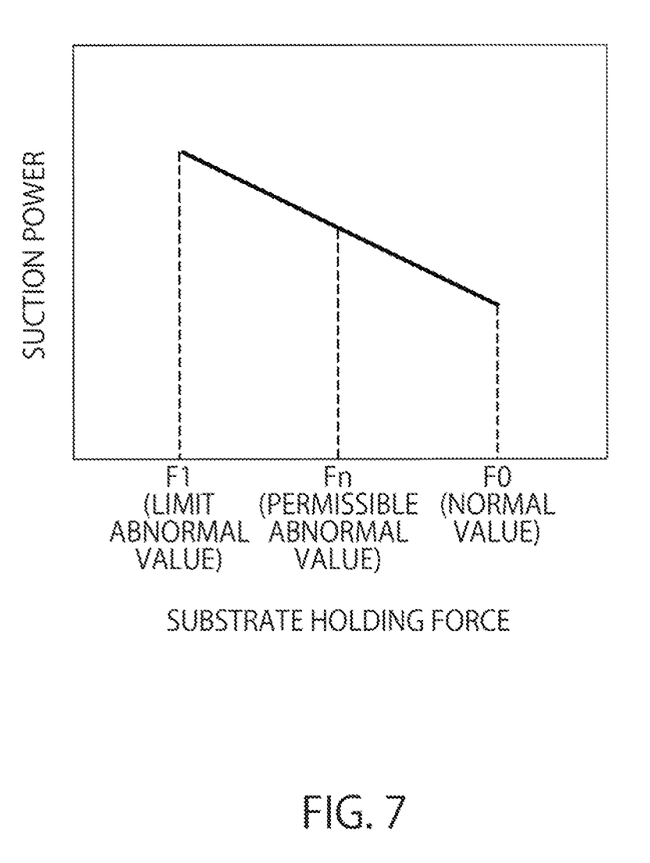
FIG. 7 illustrates the relation between a substrate holding force and a suction power in the substrate conveyance robot in FIG. 1.

Moreover, in the substrate conveyance robot 1 according to this embodiment, when the substrate holding force is the permissible abnormal value Fn which is below the normal value F0 as illustrated in FIG. 7, the robot controller 12 increases power of the vacuum source (holding force generation unit) 32 in accordance with a degradation amount of the substrate holding force. Here, the power of the vacuum source (holding force generation unit) 32 corresponds to a suction speed and a suction amount upon evacuating.

It can be understood from the above description that an operating method of the substrate conveyance robot 1 according to this embodiment has the steps below.

Namely, the operating method has a holding force detection step of detecting the substrate holding force exerted by the substrate holding unit 13, an upper limit value determination step of determining the respective upper limit values of acceleration and speed of the end effector in accordance with the substrate holding force when the substrate holding force declines below the normal value F0, and an arm drive step of driving the robot arm 4 based on the upper limit values of acceleration and speed of the end effector 7.

Moreover, the operating method has a step of increasing the power of the holding force generation unit (vacuum source 32) when the substrate holding force declines below the normal value F0.

As described above, in the substrate conveyance robot 1 according to this embodiment, the substrate holding force exerted by the substrate holding unit 13 is detected by the vacuum sensor (holding force detection unit) 33 and the respective upper limit values of acceleration and speed of the end effector 7 is determined in accordance with the detection result. Therefore, displacement and fall of the substrate S can be surely prevented while continuing the substrate conveyance operation regardless of the existence of displacement of the substrate S even when the substrate holding force in the end effector 7 declines below the normal value F0.

Particularly, even when an appropriate evacuating cannot be performed in the substrate holding unit 13 and the substrate holding force declines below the normal value F0 because the substrate S is warped due to a heat treatment or the like in the substrate manufacturing process, or the back surface of the substrate S is damaged or stained, such an abnormal state can be detected so as to take an appropriate measure.

Also, in the substrate conveyance robot 1 in this embodiment, when the substrate holding force is the permissible abnormal value Fn which is below the normal value F0, the robot controller 12 is configured to increase power of the vacuum source (holding force generation unit) 32 in accordance with a degradation amount of the substrate holding force. Therefore, the declined substrate holding force can be increased.

Next, the substrate conveyance robot according to another embodiment of the present invention will be described referring to the drawings. Note that portions different from the above-stated embodiment in FIG. 1 will be described below and descriptions of the common portions will be omitted.

Figure 8:
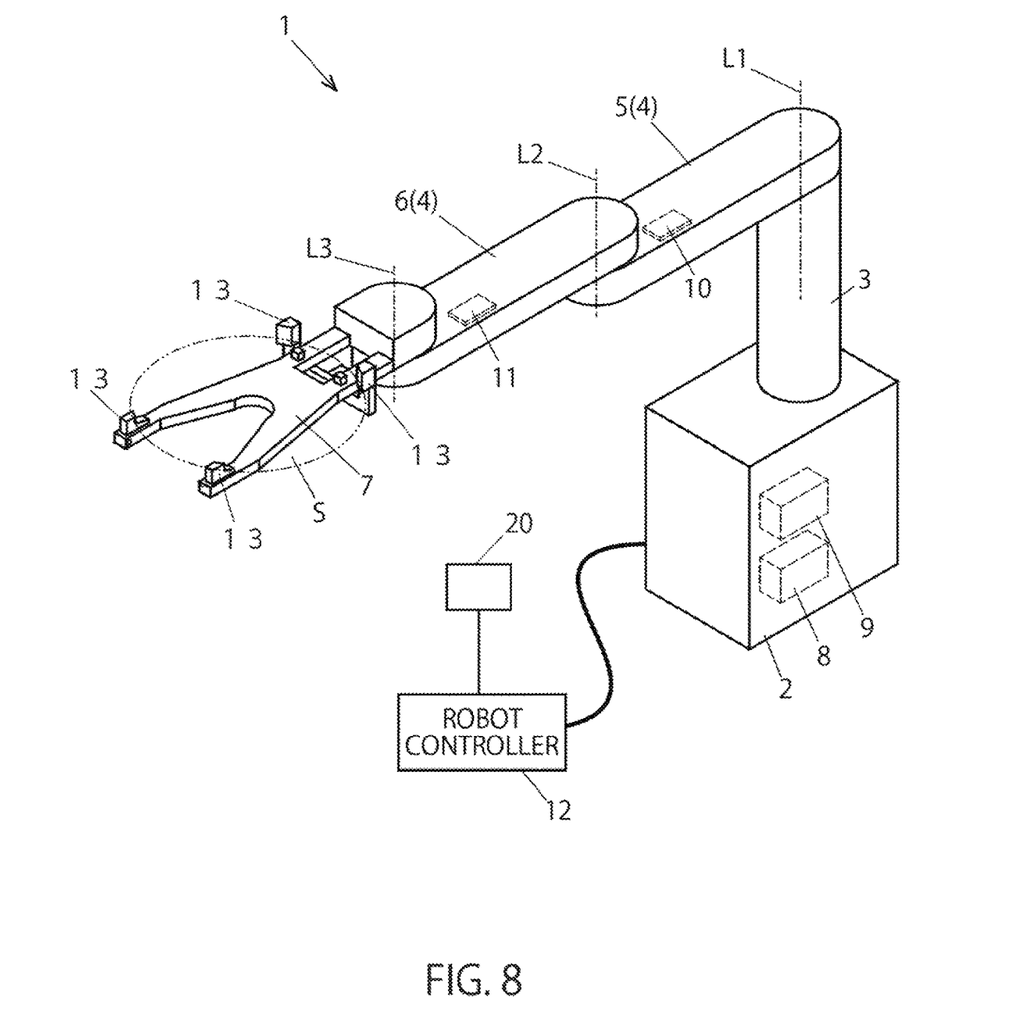
FIG. 8 is a schematic perspective view of a substrate conveyance robot according to another embodiment of the present invention.
Figure 9:
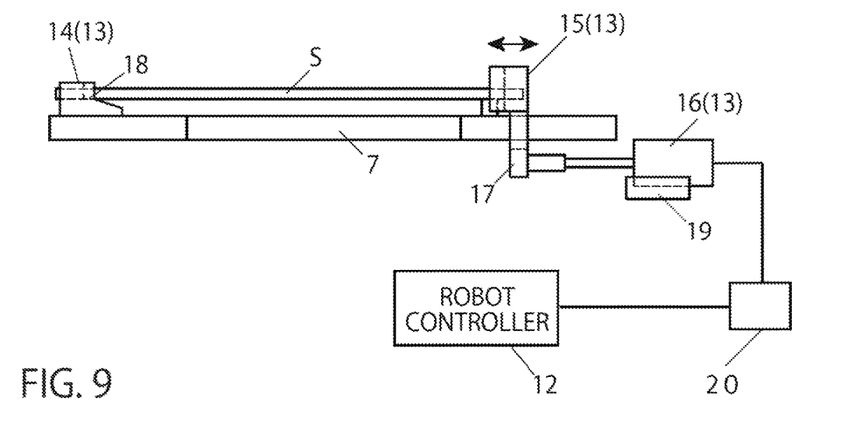
FIG. 9 is an enlarged schematic side view of a main part of the substrate conveyance robot in FIG. 8.
Figure 10:
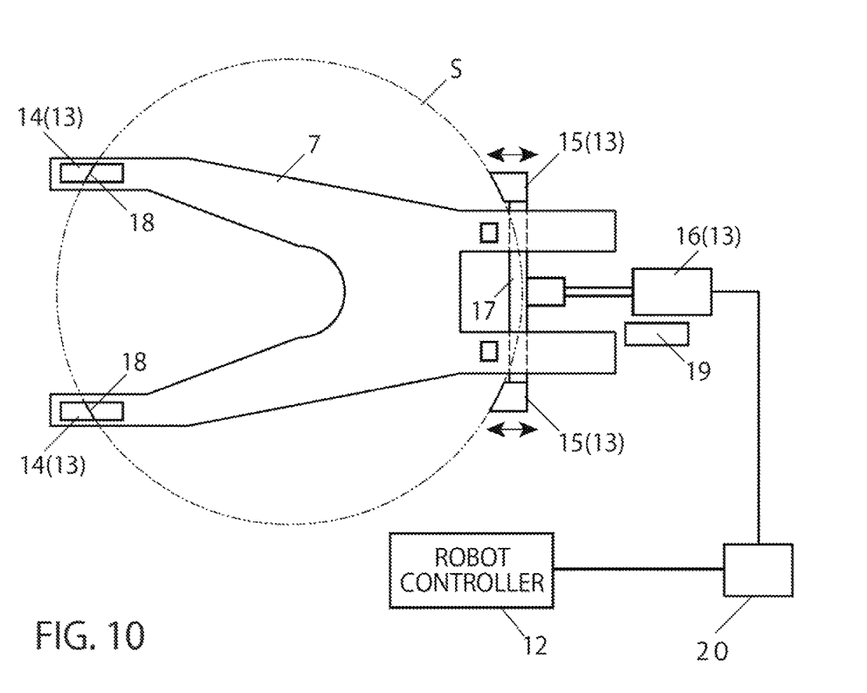
FIG. 10 is an enlarged schematic plan view of the main part of the substrate conveyance robot in FIG. 8.

As illustrated in FIG. 8 to FIG. 10, in the substrate conveyance robot 1 according to this embodiment, the substrate holding unit 13 for holding the substrate S has fixed engagement portions 14 for engaging with the respective leading edge portions of the substrate S, movable engagement portions 15 for releasably engaging with the respective trailing edge portions of the substrate S, and a plunger 16 for driving the movable engagement portions 15 backward and forward.

The fixed engagement portion 14 is provided to the respective distal end portions of a forked end effector 7. The movable engagement portion 15 is provided, on the proximal side of the end effector 7, to either end portion of an elongated member 17 extending in a direction perpendicular to the longitudinal axis line of the end effector 7. A step portion 18 is formed in the fixed engagement portion 14, and the substrate S is placed on the step portion 18.

In the substrate conveyance robot 1 according to this embodiment, a holding state and a non-holding state of the substrate S on the end effector 7 can be switched by driving the plunger 16 forward and backward by the robot controller 12.

As illustrated in FIG. 9 and FIG. 10, a position sensor 19 for detecting a position of the plunger 16 is provided adjacently to the plunger 16. The position sensor 19 can determine whether the substrate S is held on the end effector 7 or not.

Moreover, the substrate conveyance robot 1 according to this embodiment has a pressure sensor 20 for detecting a pressure of the plunger 16. The pressure sensor 20 configures a holding force detection unit configured to detect the substrate holding force in the end effector 7. Namely, a pressure of the plunger 16 detected by the pressure sensor (holding force detection unit) 20 corresponds to the substrate holding force in the end effector 7. An output signal of the pressure sensor 20 is transmitted to the robot controller 12.

Also in this embodiment, similarly to the above-stated embodiment in FIG. 1, the robot controller 12 determines the respective upper limit values of acceleration and speed of the end effector 7 based on the substrate holding force (pressure of plunger 16) detected by the holding force detection unit (pressure sensor 20).

Also, the robot controller 12 increases power of the plunger 16 in accordance with decline in the substrate holding force. Here, the power of the plunger 16 corresponds to the pressure of a pressurized fluid (such as compressed air) supplied to the plunger 16.

Also in the substrate conveyance robot according to this embodiment in FIG. 8, an excellent effect similar to that of the substrate conveyance robot according to the above-stated embodiment in FIG. 1 can be obtained.

Note that, in each embodiment stated above, the respective upper limit values of both acceleration and speed of the end effector are determined based on the substrate holding force detected by the holding force detection unit. However, only the upper limit value of acceleration of the end effector 7 may be determined in accordance with the substrate holding force, omitting determination of the upper limit value of speed.

Also, in each embodiment stated above, power of the holding force generation unit is increased when the substrate holding force detected by the holding force detection unit declines below the normal value. However, this step also can be omitted.

Figure 11:
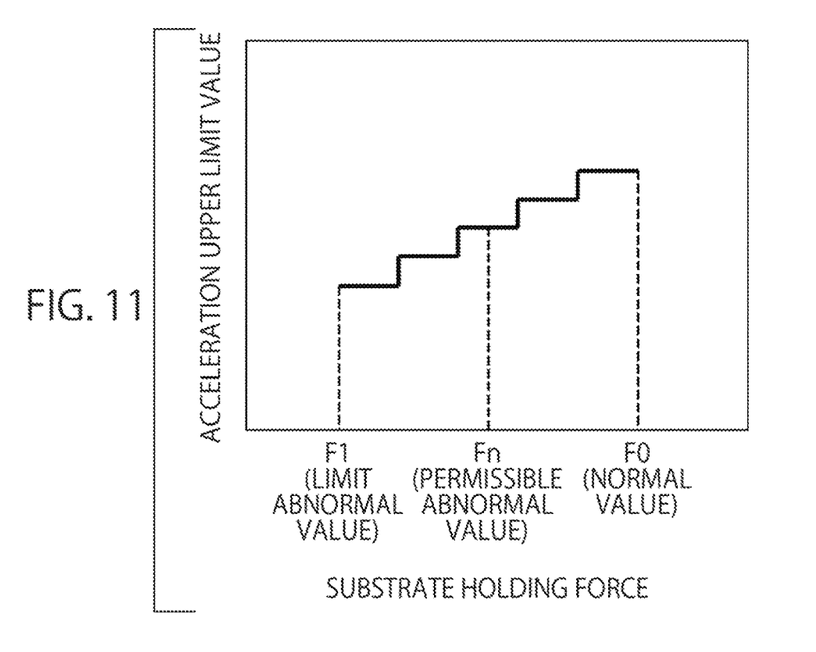
FIG. 11 illustrates the relation between a substrate holding force and an acceleration upper limit value in an variation of the substrate conveyance robot in FIG. 1.
Figure 12:
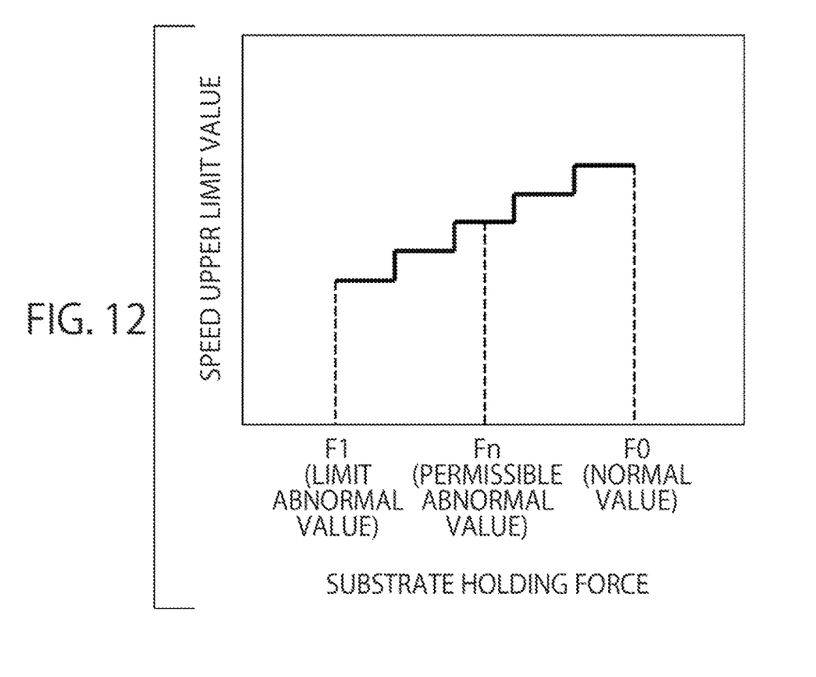
FIG. 12 illustrates the relation between a substrate holding force and a speed upper limit value in an variation of the substrate conveyance robot in FIG. 1.
Figure 13:
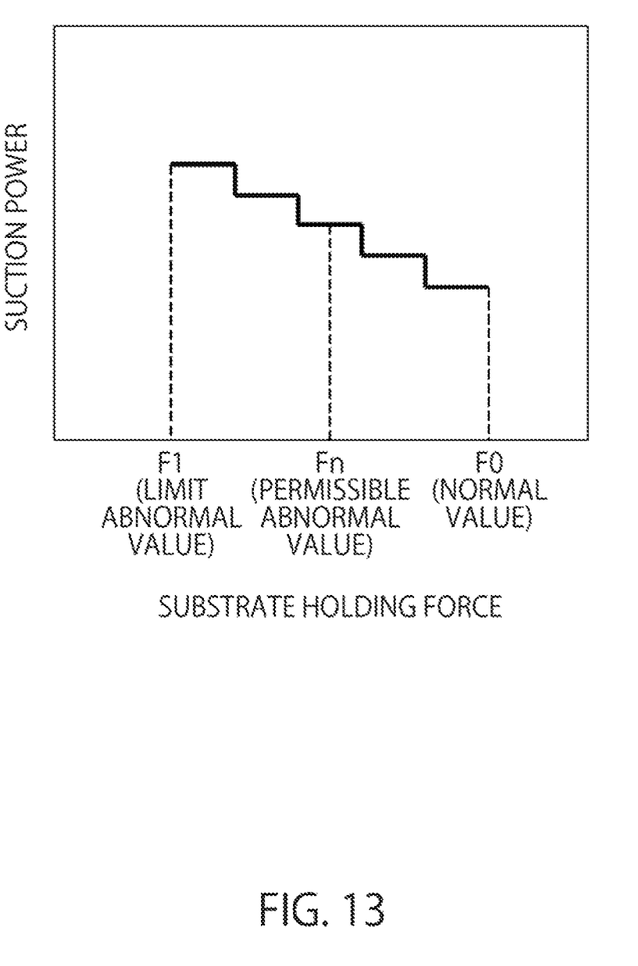
FIG. 13 illustrates the relation between a substrate holding force and a suction power in an variation of the substrate conveyance robot in FIG. 1.

Also, in each embodiment stated above, the upper limit value of acceleration, the upper limit value of speed, and a suction power (pressure) are continuously varied in accordance with variation in the substrate holding force as illustrated in FIG. 5 to FIG. 7. However, alternatively, they may be varied not continuously but stepwise as illustrated in FIG. 11 to FIG. 13.

Also, in each embodiment stated above, detection of the substrate holding force by the holding force detection unit and/or determination of the upper limit value of acceleration or the like of the end effector according to the detected substrate holding force may be performed in real time or during robot operation. By performing processing in real time or during robot operation in this manner, displacement and fall of the substrate can be surely prevented even when a substrate holding state of the end effector is varied during substrate conveyance, by responding to the state timely.

Figure 14:
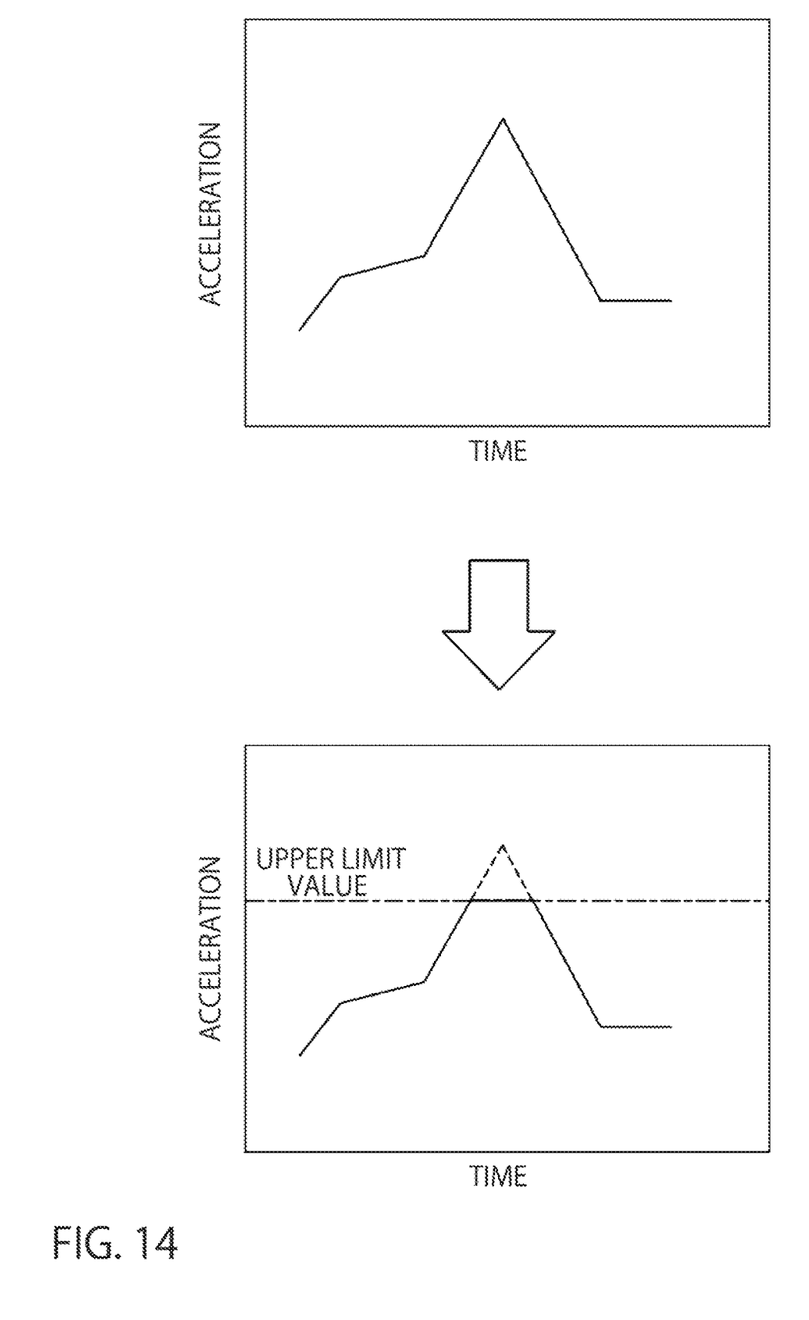
FIG. 14 illustrates an example of the control method in the substrate conveyance robot according to the above-mentioned embodiments and variation of the invention.

FIG. 14 illustrates an example of a control method in the substrate conveyance robot according to each embodiment and variation stated above. As illustrated in FIG. 14, once the upper limit value of acceleration (or speed) of operation patterns of substrate conveyance is set, a part exceeding said upper limit value in the original setting (upper diagram) is set according to said upper limit value after setting said upper limit value (lower diagram).

Figure 15:
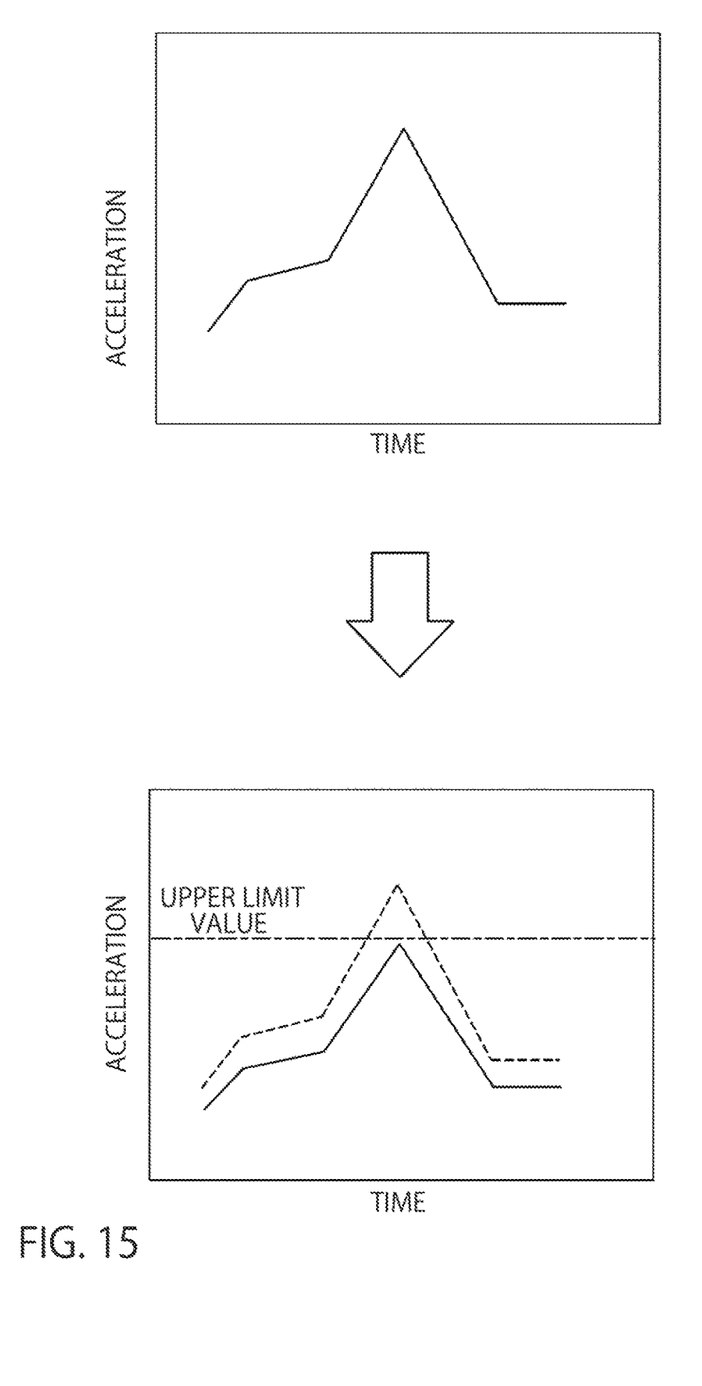
FIG. 15 illustrates another example of the control method in the substrate conveyance robot according to the above-mentioned embodiments and variation of the invention.

FIG. 15 illustrates another example of a control method in the substrate conveyance robot according to each embodiment and variation stated above. As illustrated in the figure, a peak of acceleration (or speed) can also be below the upper limit value by downwardly shifting acceleration (or speed) of operation patterns of substrate conveyance as a whole.

DESCRIPTION OF REFERENCE NUMERALS

1 . . . substrate conveyance robot
2 . . . base
3 . . . rotary main shaft
4 . . . robot arm
5 . . . first link member
6 . . . second link member
7 . . . end effector (hand)
8 . . . drive source for elevating/lowering operation of rotary main shaft
9 . . . drive source for rotational operation of rotary main shaft and first link member (arm drive unit)
10 . . . drive source for rotational operation of second link member (arm drive unit)
11 . . . drive source for rotational operation of end effector (arm drive unit)
12 . . . robot controller (robot control unit)
13 . . . substrate holding unit
14 . . . fixed engagement portion (substrate holding unit)
15 . . . movable engagement portion (substrate holding unit)
16 . . . plunger (substrate holding unit)
17 . . . elongated member (substrate holding unit)
18 . . . step portion of fixed engagement portion
19 . . . position sensor
20 . . . pressure sensor (holding force detection unit)
21 . . . substrate storing container
22 . . . substrate supporting portion of substrate storing container
30 . . . substrate holding aperture (substrate holding unit)
31 . . . evacuating flow passage (substrate holding unit)
32 . . . vacuum source (substrate holding unit)
33 . . . vacuum sensor (holding force detection unit)
L1 . . . first rotational axis line
L2 . . . second rotational axis line
L3 . . . third rotational axis line
S . . . substrate

The invention claimed is:
1. A substrate conveyance robot comprising:
a robot arm;
an end effector provided to the robot arm, the end effector having a substrate holding unit configured to hold a substrate, the substrate holding unit having a holding force generation unit configured to generate a substrate holding force;
an arm drive unit configured to drive the robot arm;
a robot control unit configured to control the arm drive unit; and a holding force detection unit configured to detect the substrate holding force exerted by the substrate holding unit, wherein the robot control unit is configured to:

control the arm drive unit based on an upper limit value of at least one of an acceleration of the end effector and a speed of the end effector, the respective upper limit values are each determined in accordance with the substrate holding force detected by the holding force detection unit; and increase a power of the holding force generation unit when the substrate holding force declines below a normal value of the power of the holding force generation unit.

2. The substrate conveyance robot according to claim 1, wherein the robot control unit is configured to control the arm drive unit based on both the upper limit value of the acceleration of the end effector and the upper limit value of the speed of the end effector.

3. The substrate conveyance robot according to claim 1, wherein:

the substrate holding unit is configured to vacuum suck the substrate, and the holding force detection unit is configured to detect a vacuum degree of the substrate holding unit.

4. The substrate conveyance robot according to claim 1, wherein:

the substrate holding unit has a movable engagement portion configured to releasably engage with an edge portion of the substrate, and a plunger configured to drive the movable engagement portion, and the holding force detection unit is configured to detect a pressure of the plunger.

5. The substrate conveyance robot according to claim 1, wherein the robot control unit is configured to continuously vary the upper limit value in accordance with the substrate holding force detected by the holding force detection unit.

6. The substrate conveyance robot according to claim 1, wherein the robot control unit is configured to vary the upper limit value in a stepwise manner in accordance with the substrate holding force detected by the holding force detection unit.

7. An operating method of a substrate conveyance robot including a robot arm provided with an end effector including a substrate holding unit configured to hold a substrate, the operating method comprising:

a holding force detection step of detecting a substrate holding force exerted by the substrate holding unit, the substrate holding unit having a holding force generation unit configured to generate the substrate holding force, a power of the holding force generation unit increasing when the substrate holding force declines below a normal value of the power of the holding force generation unit;

an upper limit value determination step of determining an upper limit value of at least one of an acceleration of the end effector and a speed of the end effector in accordance with the substrate holding force; and an arm drive step of driving the robot arm based on the determined at least one upper limit value of the end effector.

8. The operating method of the substrate conveyance robot according to claim 7, wherein, in the arm drive step, the robot arm is driven based on both the upper limit value of the acceleration of the end effector and the upper limit value of the speed of the end effector.

9. The operating method of the substrate conveyance robot according to claim 7, wherein the determined upper limit value is continuously varied in accordance with the substrate holding force.

10. The operating method of the substrate conveyance robot according to claim 7, wherein the determined upper limit value is varied in a stepwise manner in accordance with the substrate holding force.

* * * * *